United States Patent
Takayama et al.

(10) Patent No.: US 10,732,211 B2
(45) Date of Patent: Aug. 4, 2020

(54) TRANSMISSION CHARACTERISTICS MEASURING METHOD AND TRANSMISSION CHARACTERISTICS MEASURING APPARATUS

(71) Applicant: Murata Manufacturing Co., Ltd., Kyoto-fu (JP)

(72) Inventors: Kota Takayama, Nagaokakyo (JP); Yoshihiro Imanishi, Nagaokakyo (JP); Yu Ishiwata, Nagaokakyo (JP); Kiyomi Ikemoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 222 days.

(21) Appl. No.: 15/586,754

(22) Filed: May 4, 2017

(65) Prior Publication Data
US 2017/0356940 A1    Dec. 14, 2017

(30) Foreign Application Priority Data
Jun. 13, 2016    (JP) .................................. 2016-116760

(51) Int. Cl.
*G01R 27/28*        (2006.01)

(52) U.S. Cl.
CPC .................................. *G01R 27/28* (2013.01)

(58) Field of Classification Search
CPC .............................. G01R 27/28; G01R 31/00
USPC ................................................. 324/637–647
See application file for complete search history.

(56) References Cited

U.S. PATENT DOCUMENTS

| | | | | |
|---|---|---|---|---|
| 5,677,633 A | * | 10/1997 | Moser | G01R 31/021 324/539 |
| 5,793,213 A | * | 8/1998 | Bockelman | G01R 35/005 324/601 |
| 2002/0053898 A1 | * | 5/2002 | Ademian | G01R 27/28 324/76.19 |
| 2004/0193382 A1 | * | 9/2004 | Adamian | G01R 27/28 702/118 |
| 2008/0048673 A1 | * | 2/2008 | Tan | G01R 1/06772 324/601 |
| 2011/0025297 A1 | * | 2/2011 | Sato | G01R 27/28 324/76.39 |
| 2012/0109566 A1 | * | 5/2012 | Adamian | G01R 27/28 702/107 |

OTHER PUBLICATIONS

MIPI Alliance; MIPI D-PHY Standards (http://mipi.org/specifications/physical-layer #D-PHY Specification).

* cited by examiner

*Primary Examiner* — Jeff W Natalini
(74) *Attorney, Agent, or Firm* — Studebaker & Brackett PC (57) ABSTRACT

An S-parameter of an object to be measured is measured, which includes (i) three transmission lines configured such that a ternary signal is transmitted through a corresponding one of the three transmission lines and (ii) six ports as total ports included in the three transmission lines each having a pair of ports. Based on the measured S-parameter, a parameter is calculated, which shows transparent characteristics in each mode among mixed-mode S-parameters in accordance with transition patterns of signal levels on the three transmission lines.

10 Claims, 9 Drawing Sheets

FIG.4B $$\begin{pmatrix} b_1 \\ b_2 \\ b_3 \\ b_4 \\ b_5 \\ b_6 \end{pmatrix} = \begin{pmatrix} S_{11} & S_{12} & S_{13} & S_{14} & S_{15} & S_{16} \\ S_{21} & S_{22} & S_{23} & S_{24} & S_{25} & S_{26} \\ S_{31} & S_{32} & S_{33} & S_{34} & S_{35} & S_{36} \\ S_{41} & S_{42} & S_{43} & S_{44} & S_{45} & S_{46} \\ S_{51} & S_{52} & S_{53} & S_{54} & S_{55} & S_{56} \\ S_{61} & S_{62} & S_{63} & S_{64} & S_{65} & S_{66} \end{pmatrix} \begin{pmatrix} a_1 \\ a_2 \\ a_3 \\ a_4 \\ a_5 \\ a_6 \end{pmatrix}$$

$\underbrace{\phantom{xxxx}}_{=B}$ $\underbrace{\phantom{xxxxxxxxxxxxxxxxxxxx}}_{=S}$ $\underbrace{\phantom{xxxx}}_{=A}$

FIG.5A

FIG.5B $$\begin{pmatrix} b_{X1} \\ b_{X2} \\ b_{Y1} \\ b_{Y2} \\ b_{Z1} \\ b_{Z2} \end{pmatrix} = \begin{pmatrix} S_{XX11} & S_{XX12} & S_{XY11} & S_{XY12} & S_{XZ11} & S_{XZ12} \\ S_{XX21} & S_{XX22} & S_{XY21} & S_{XY22} & S_{XZ21} & S_{XZ22} \\ S_{YX11} & S_{YX12} & S_{YY11} & S_{YY12} & S_{YZ11} & S_{YZ12} \\ S_{YX21} & S_{YX22} & S_{YY21} & S_{YY22} & S_{YZ21} & S_{YZ22} \\ S_{ZX11} & S_{ZX12} & S_{ZY11} & S_{ZY12} & S_{ZZ11} & S_{ZZ12} \\ S_{ZX21} & S_{ZX22} & S_{ZY21} & S_{ZY22} & S_{ZZ21} & S_{ZZ22} \end{pmatrix} \begin{pmatrix} a_{X1} \\ a_{X2} \\ a_{Y1} \\ a_{Y2} \\ a_{Z1} \\ a_{Z2} \end{pmatrix}$$

$\underbrace{\phantom{XXX}}_{=Bm} \quad \underbrace{\phantom{XXXXXXXXXXXXXXX}}_{=Sm} \quad \underbrace{\phantom{XXX}}_{=Am}$

TRANSMISSION CHARACTERISTICS MEASURING METHOD AND TRANSMISSION CHARACTERISTICS MEASURING APPARATUS

CROSS REFERENCE TO RELATED APPLICATIONS

This application claims benefit of priority to Japanese Patent Application 2016-116760 filed Jun. 13, 2016, the entire content of which is incorporated herein by reference.

TECHNICAL FIELD

The present disclosure relates to a transmission characteristics measuring method and a transmission characteristics measuring apparatus.

BACKGROUND

MIPI D-PHY standards are defined as a signal interface between an integrated circuit element inside a mobile device and a display or a camera module. An MIPI (Mobile Industry Processor Interface) is a type of internal interfaces inside the mobile device. The D-PHY standards employ a differential transmission scheme in which signals transmitted through two wires establish a relation in phases opposite to each other.

A mixed-mode S-parameter is used as an evaluation indicator for components inserted into a transmission line in the differential transmission scheme or for a substrate on which the transmission line is formed. The mixed-mode S-parameter can be calculated from a normal S-parameter (which is referred to as a single-ended S-parameter). When the mixed-mode S-parameter is used, the transmission characteristics of a signal can be readily evaluated for each mode such as a normal mode and a common mode.

SUMMARY

In recent years, a 3-line transmission scheme (MIPI C-PHY standards) has been proposed. In the transmission scheme according to the MIPIC-PHY standards, the speed of signal transmission can be increased as compared with the transmission scheme according to the MIPI D-PHY standards. For the signals transmitted in the transmission scheme according to the MIPI C-PHY standards, countermeasures against noise are taken. In order to take effective countermeasures against noise, it is desired to achieve a method of objectively evaluating the characteristics of: components connected to a transmission line in a 3-line transmission scheme; and a substrate on which the transmission line is formed.

The characteristics of the component applied to the conventional 2-line differential transmission scheme can be evaluated using the conventional mixed-mode S-parameter. In the transmission scheme according to the MIPI C-PHY standards, however, a signal is transmitted through three transmission lines, and further, the signal transmission pattern is also complicated. Accordingly, it is difficult to evaluate the components applied to the transmission scheme according to the MIPI C-PHY standards using the conventional mixed-mode S-parameter.

An object of the present disclosure is to provide a transmission characteristics measuring method and a transmission characteristics measuring apparatus that are suitable for evaluating the transmission characteristics of transmission lines and components applied to the 3-line transmission scheme.

A transmission characteristics measuring method according to the first aspect of the present disclosure includes: measuring an S-parameter of an object to be measured, the object to be measured including (i) three transmission lines configured such that a ternary signal is transmitted through a corresponding one of the three transmission lines and (ii) six ports as total ports included in the three transmission lines each having a pair of ports; and based on the S-parameter measured, calculating a parameter showing transparent characteristics in each mode among mixed-mode S-parameters in accordance with transition patterns of signal levels on the three transmission lines.

By using the mixed-mode S-parameters in accordance with the transition patterns of the signal levels on the three transmission lines, the transmission characteristics of the transmission line and the component applied to the 3-line transmission scheme can be evaluated.

In addition to the transmission characteristics measuring method according to the first aspect, in the transmission characteristics measuring method according to the second aspect of the present disclosure, the mixed-mode S-parameters are defined in a mode space including a plurality of modes when a transition pattern showing equivalent variations of the signal levels on the three transmission lines is defined as one mode, and when a transition pattern showing an identical variation of the signal levels on all of the three transmission lines is defined as the other mode.

The transition pattern showing the identical variation of the signal levels on all of the three transmission lines corresponds to a common mode noise. This transition pattern is defined as one mode, thereby allowing evaluation of a common mode noise.

In addition to the transmission characteristics measuring method according to each of the first and second aspects, in the transmission characteristics measuring method according to the third aspect of the present disclosure, the S-parameter is a 6-port S-parameter. Furthermore, the measuring of an S-parameter includes measuring the S-parameter in a state where each of the test ports of a transmission characteristics measuring apparatus having at least six test ports is connected to a corresponding one of the six ports of the object to be measured.

The mixed-mode S-parameters of the object to be measured that has six ports can be calculated without changing the configuration of connection between the object to be measured and the transmission characteristics measuring apparatus.

In addition to the transmission characteristics measuring method according to each of the first and second aspects, in the transmission characteristics measuring method according to the fourth aspect of the present disclosure, the S-parameter includes three types of 4-port S-parameters. Furthermore, the measuring of an S-parameter includes performing a procedure for measuring a 4-port S-parameter in a state where each of four test ports of a transmission characteristics measuring apparatus is connected to a corresponding one of four ports corresponding to two transmission lines of the three transmission lines of the object to be measured while two ports of one remaining transmission line of the three transmission lines are reflection-free terminated, the procedure being performed in different combinations of two transmission lines connected to the transmission characteristics measuring apparatus, to thereby measure three types of 4-port S-parameters.

The mixed-mode S-parameters of the object to be measured having six ports can be calculated using the transmission characteristics measuring apparatus having four ports.

In addition to the transmission characteristics measuring method according to each of the first to fourth aspects, in the transmission characteristics measuring method according to the fifth aspect of the present disclosure, each of the three transmission lines of the object to be measured extends continuously from one port to the other port.

The transmission characteristics of the transmission line itself can be evaluated.

In addition to the transmission characteristics measuring method according to each of the first to fourth aspects, in the transmission characteristics measuring method according to the sixth aspect of the present disclosure, a noise filter is inserted into the three transmission lines of the object to be measured.

The transmission characteristics of the noise filter can be evaluated.

A transmission characteristics measuring apparatus according to the seventh aspect of the present disclosure includes: at least six test ports; and a display device. The transmission characteristics measuring apparatus is configured to measure a 6-port S-parameter in a state where each of the six test ports is connected to a corresponding one of six ports of an object to be measured, the object to be measured including (i) three transmission lines configured such that a ternary signal is transmitted through a corresponding one of the three transmission lines and (ii) the six ports as total ports included in the three transmission lines each having a pair of ports; based on the 6-port S-parameter measured, calculate a parameter showing transparent characteristics in each mode among mixed-mode S-parameters in accordance with transition patterns of signal levels on the three transmission lines; and cause the display device to display a calculation result.

The 6-port S-parameter can be measured without changing the configuration of connection between the object to be measured and the transmission characteristics measuring apparatus. By the calculation result displayed on the display device, the transparent characteristics in each mode of the mixed-mode S-parameters can be readily acquired.

A transmission characteristics measuring apparatus according to the eighth aspect of the present disclosure includes: four test ports; and a display device. The transmission characteristics measuring apparatus is configured to: for an object to be measured including (i) three transmission lines configured such that a ternary signal is transmitted through a corresponding one of the three transmission lines and (ii) six ports as total ports included in the three transmission lines each having a pair of ports, perform a procedure for measuring a 4-port S-parameter in a state where each of the four test ports is connected to a corresponding one of four ports of two transmission lines of the three transmission lines while two ports of one remaining transmission line of the three transmission lines are reflection-free terminated, the procedure being performed in different combinations of two transmission lines connected to the four test ports, to thereby measure three types of 4-port S-parameters; based on the three types of 4-port S-parameters measured, calculate a parameter showing transparent characteristics in each mode among mixed-mode S-parameters in accordance with transition patterns of signal levels on the three transmission lines; and cause the display device to display a calculation result.

The 6-port S-parameter of the object to be measured having six ports can be measured using the transmission characteristics measuring apparatus having four ports. By the calculation result displayed on the display device, the transparent characteristics in each mode of the mixed-mode S-parameters can be readily acquired.

In addition to the transmission characteristics measuring apparatus according to the eighth aspect, the transmission characteristics measuring apparatus according to the ninth aspect of the present disclosure further includes an input device. The transmission characteristics measuring apparatus is configured to receive, through the input device, information showing the four ports each connected to a corresponding one of the four test ports among the six ports of the object to be measured, so as to associate the 4-port S-parameters measured and ports of the object to be measured with each other.

The 4-port S-parameters and the ports to be measured can be associated with each other by using the information input through the input device. Thereby, the mixed-mode S-parameters of the object to be measured having six ports can be calculated from the 4-port S-parameters.

In addition to the transmission characteristics measuring apparatus according to the eighth aspect, the transmission characteristics measuring apparatus according to the tenth aspect of the present disclosure is configured to cause the display device to display information showing the four ports each to be connected to a corresponding one of the four test ports among the six ports of the object to be measured; and, based on the information displayed on the display device, associate the 4-port S-parameters measured and ports of the object to be measured with each other.

An operator may connect the object to be measured and the transmission characteristics measuring apparatus only by checking the information displayed on the display device.

The foregoing and other objects, features, aspects and advantages of the present disclosure will become more apparent from the following detailed description of the present disclosure when taken in conjunction with the accompanying drawings.

DETAILED DESCRIPTION

First Embodiment

Referring to FIG. 1A to FIG. 6, a transmission characteristics measuring method and a transmission characteristics measuring apparatus according to the first embodiment will be hereinafter described.

Figure 1A:
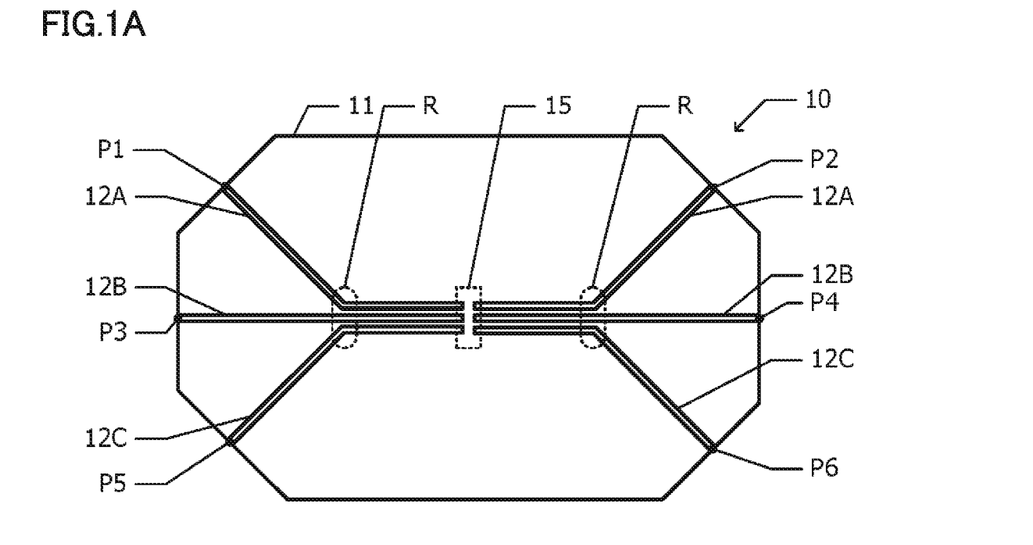
FIGS. 1A and 1B are plan views each showing an example of a component mounting substrate used in a transmission characteristics measuring method according to an embodiment.

FIG. 1A is a plan view showing a component mounting substrate 11 used in a transmission characteristics measuring method according to an embodiment. On component mounting substrate 11, three transmission lines 12A, 12B and 12C are formed, through which ternary signals (for example, signals that can attain values of an L level, an M level, and an H level) are transmitted. Transmission lines 12A, 12B and 12C each are formed, for example, of a microstrip line. The characteristic impedance on each of transmission lines 12A, 12B and 12C is 50Ω, for example. A component mounting portion 15 is provided almost in the middle of each of transmission lines 12A, 12B and 12C in the longitudinal direction. Each of transmission lines 12A, 12B and 12C is cut at component mounting portion 15. A circuit component is inserted into the cut portion, thereby connecting transmission lines 12A, 12B and 12C via the circuit component.

Examples of the circuit component as an object to be measured may be a noise filter and the like. Examples of the noise filter can be a common-mode choke coil for 3 lines, mutually-independent equivalent three inductors, and the like. Each of transmission lines 12A, 12B and 12C cut at component mounting portion 15 may be short-circuited. A short-circuit of the cut portion allows each of transmission lines 12A, 12B and 12C to extend continuously from one port to the other port. Thereby, the transmission characteristics of each transmission line itself can be measured.

When a circuit component to be measured is mounted on component mounting portion 15 of component mounting substrate 11 or when a cut portion in each of transmission lines 12A, 12B and 12C is short-circuited, an object then to be measured 10 is obtained. One transmission line includes a pair of ports through which a signal is input/output. Object to be measured 10 includes a total of six ports. Specifically, object to be measured 10 includes: a port P1 on the input side and a port P2 on the output side of the first transmission line 12A; a port P3 on the input side and a port P4 on the output side of the second transmission line 12B; and a port P5 on the input side and a port P6 on the output side of the third transmission line 12C.

Transmission lines 12A, 12B and 12C extend in parallel with one another from component mounting portion 15 toward both sides to a certain point R. Beyond point R, the center transmission line 12B still linearly extends. Transmission lines 12A and 12C disposed on both sides of transmission line 12B are bent at point R so as to be inclined in the direction away from the center transmission line 12B. Transmission line 12A and transmission line 12C establish the relation of line symmetry with respect to the center transmission line 12B.

Figure 1B:
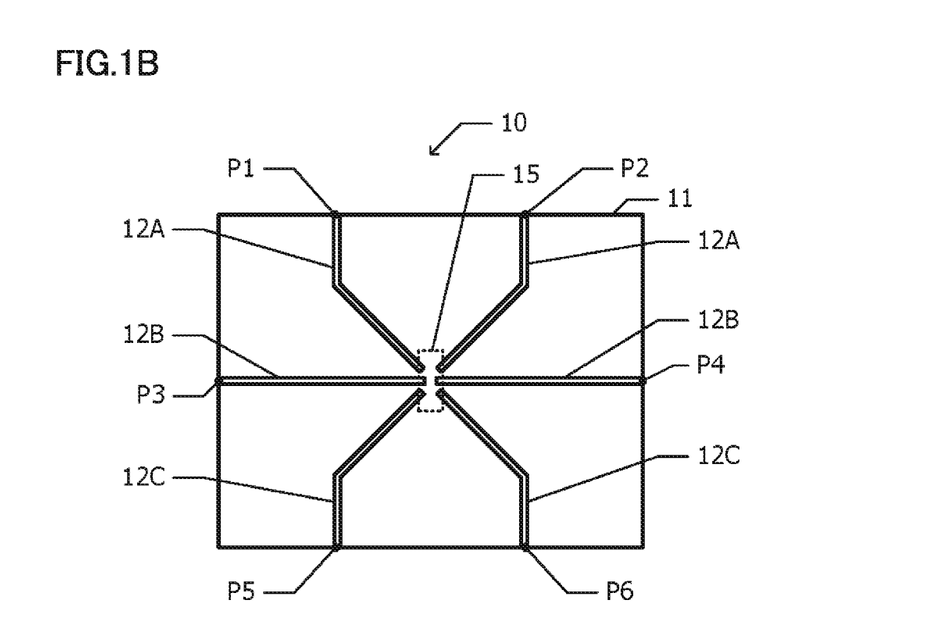

As shown in FIG. 1B, transmission lines 12A, 12B and 12C may be configured to extend radially from component mounting portion 15.

Figure 2:
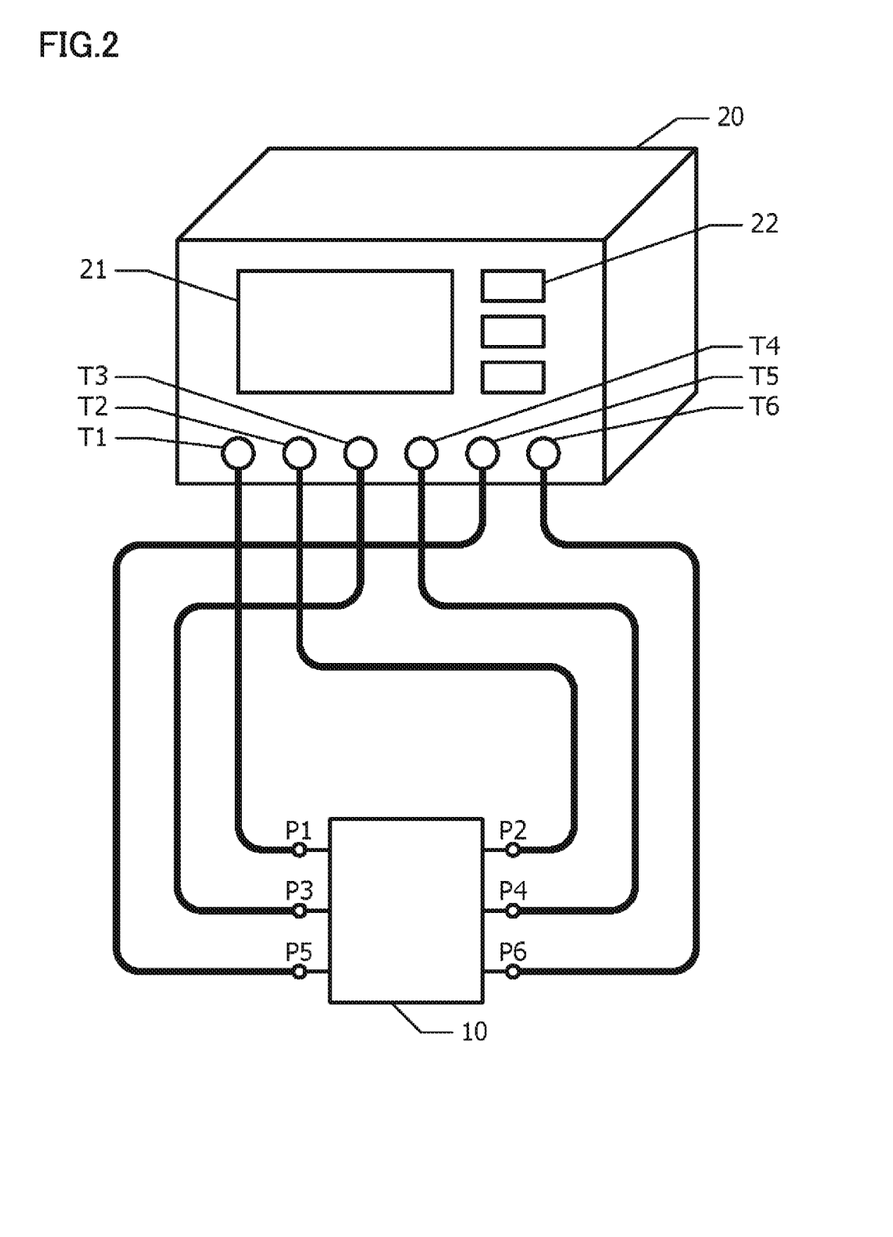
FIG. 2 is a diagram showing an example of the configuration of connection between an object to be measured and a transmission characteristics measuring apparatus.

FIG. 2 shows an example of the configuration of connection between the object to be measured 10 and a transmission characteristics measuring apparatus 20. For example, a 6-port network analyzer can be used for a transmission characteristics measuring apparatus. Transmission characteristics measuring apparatus 20 has at least six test ports T1 to T6, a display device 21, and an input device 22. Also, as transmission characteristics measuring apparatus 20, a network analyzer having seven or more test ports may be used in place of such a 6-port network analyzer. An operator inputs various commands into transmission characteristics measuring apparatus 20 through input device 22. Transmission characteristics measuring apparatus 20 causes display device 21 to display various pieces of information such as measurement results.

Ports P1, P2, P3, P4, P5, and P6 of the object to be measured 10 are respectively connected to test ports T1, T2, T3, T4, T5, and T6 of transmission characteristics measuring apparatus 20. Transmission characteristics measuring apparatus 20 has a function of measuring a general S-parameter (single-ended S-parameter) of the 6-port circuit component.

Then, referring to FIG. 3, an explanation will be given with regard to a method of classifying, into a plurality of modes, a level transition pattern of the signal conforming to the MIPI C-PHY standards.

Figure 3:
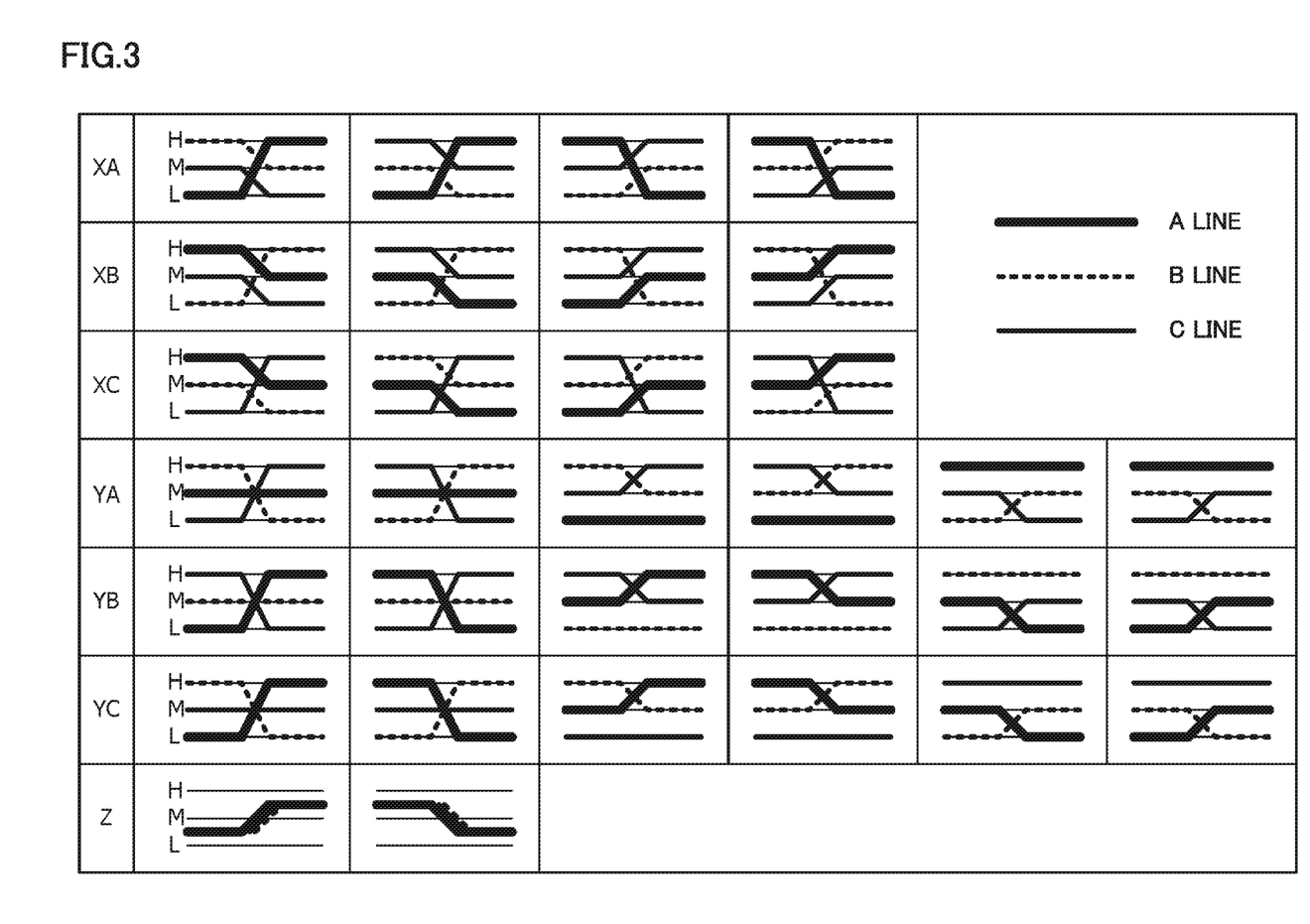
FIG. 3 is a diagram of results showing that level transition patterns conforming to the MIPI C-PHY standards are classified in each mode.

FIG. 3 shows results that the level transition pattern of a signal conforming to the MIPI C-PHY standards is classified into a plurality of modes. In FIG. 3, the thickest solid line shows an A line (for example, transmission line 12A in FIG. 1A); a dashed line shows a B line (for example, transmission line 12B in FIG. 1A); and a thin solid line shows a C line (for example, transmission line 12C in FIG. 1A). Ternary signals, for example, signals that can attain values of an L level, an M level and an H level, are transmitted through their respective lines.

In the MIPI C-PHY standards, each of the signal levels on the A line, the B line and the C line show a corresponding one of ternary values on the L level, the M level and the H level, but these plurality of lines do not attain the same level. For example, the level transition pattern in the first row in the first column in FIG. 3 shows that: the A line transitions from the L level to the H level; the B line transitions from the H level to the M level; and the C line transitions from the M level to the L level.

A plurality of level transition patterns showing an equivalent amount of signal level variations of the signal levels on the A line, the B line and the C line are defined as one mode. There is a transition pattern defined as an X mode, in which the level transition on one of the lines occurs between the L level and the H level while the level transitions on the other two lines occur between the L level and the M level or between the M level and the H level. There is also a transition pattern defined as a Y mode, in which the signal level on one of the lines does not transition while the signal levels on the other two lines transition in phases opposite to each other. That is, the above term "equivalent amount of signal level variations" is used herein to describe variations in which a summation of signal levels on the A line, the B line and the C line before a variation is the same as a summation of signal levels on the A line, the B line and the C line after the variation. For example, in an XA mode shown in FIG. 3, a summation of signal levels on the A line, the B line and the C line before a variation is one H level, one M level and one L level, and a summation of signal levels on the A line, the B line and the C line after the variation is also one H level, one M level and one L level.

The X mode includes: an XA mode showing a transition pattern in which the signal level on the A line transitions between the L level and the H level; an XB mode showing a transition pattern in which the signal level on the B line transitions between the L level and the H level; and an XC mode showing a transition pattern in which the signal level on the C line transitions between the L level and the H level. The Y mode includes: a YA mode showing a transition pattern in which the signal level on the A line does not transition; a YB mode showing a transition pattern in which the signal level on the B line does not transition; and a YC mode showing a transition pattern in which the signal level on the C line does not transition. There is also a common mode defined as a Z mode, in which the signal levels on all of the lines shift in phase. The transition width of the signal level in the Z mode is not particularly limited, and the signal level variations shown in FIG. 3 are merely by way of example.

Then, referring to FIGS. 4A and 4B, an S-parameter of a 6-port circuit component will be hereinafter described.

Figure 4A:
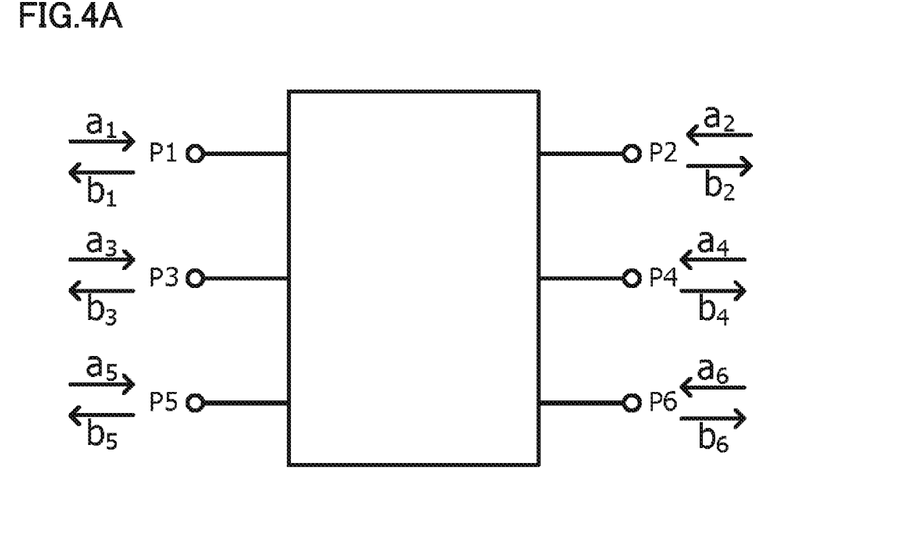
FIG. 4A is a diagram showing the relation between ports of a 6-port circuit component and input/output signals for each port.

FIG. 4A shows the relation between ports P1 to P6 of the 6-port circuit component and input/output signals for each port. Port P1 and port P2 correspond to a pair of ports through which signals are input into/output from the A line. Similarly, port P3 and port P4 correspond to a pair of ports through which signals are input into/output from the B line. Port P5 and port P6 correspond to a pair of ports through which signals are input into/output from the C line. The input signal to a port Pi (i may be 1, 2, 3, 4, 5, or 6) is indicated as $a_i$ while the output signal from port Pi is indicated as $b_i$. In this case, $a_i$ and $b_i$ each show a square root of the signal power.

Figure 4B:
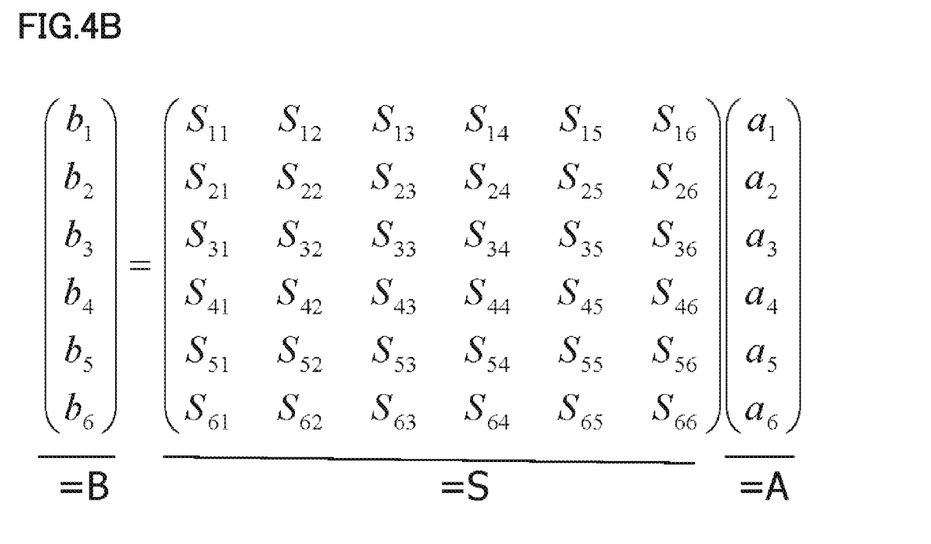
FIG. 4B is a diagram showing the relation among an input signal, an output signal and an S-parameter.

FIG. 4B shows the relation among an input signal $a_i$, an output signal $b_i$ and an S-parameter. When the matrix showing input signal $a_i$ is indicated as A; the matrix showing output signal $b_i$ is indicated as B; and the matrix showing an S-parameter is indicated as S, the following expression can be achieved:

$$B=SA \quad (1)$$

Then, referring to FIGS. 5A and 5B, a mixed-mode S-parameter of a 3-line and 6-port circuit component will be hereinafter described. Assuming that the signal levels showing equivalent transition patterns are collectively defined as one mode, the mixed-mode S-parameter is defined in a mode space formed of a plurality of modes.

Figure 5A:
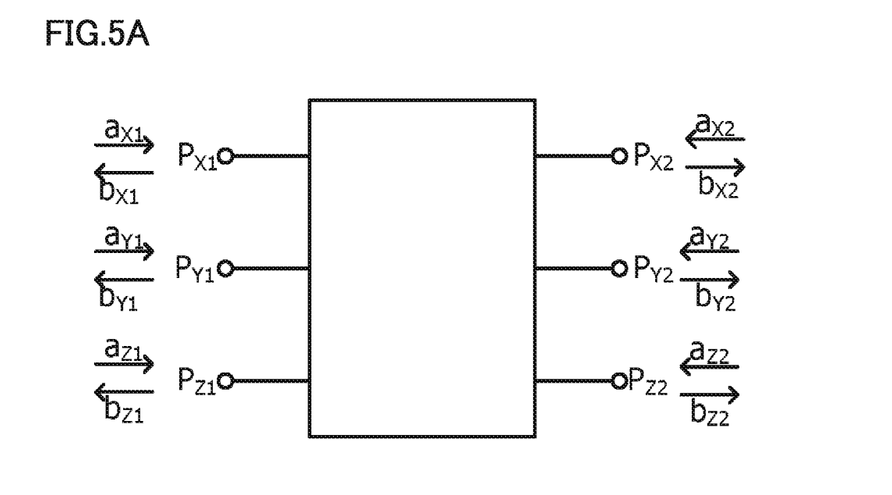
FIG. 5A is a diagram showing the relation between six ports in a mode space and the input/output modes.

FIG. 5A shows the relation between six ports in a mode space and the input/output modes. A port $P_{X1}$ and a port $P_{X2}$ correspond to a pair of ports through which a signal in the X mode is input/output. A port $P_{Y1}$ and a port $P_{Y2}$ correspond to a pair of ports through which a signal in the Y mode is input/output. A port $P_{Z1}$ and a port $P_{Z2}$ correspond to a pair of ports through which a signal in the Z mode is input/output. The input mode signal to port Pi (i may be X1, X2, Y1, Y2, Z1, or Z2) is indicated as $a_i$ while the output mode signal from port Pi is indicated as $b_i$.

Figure 5B:
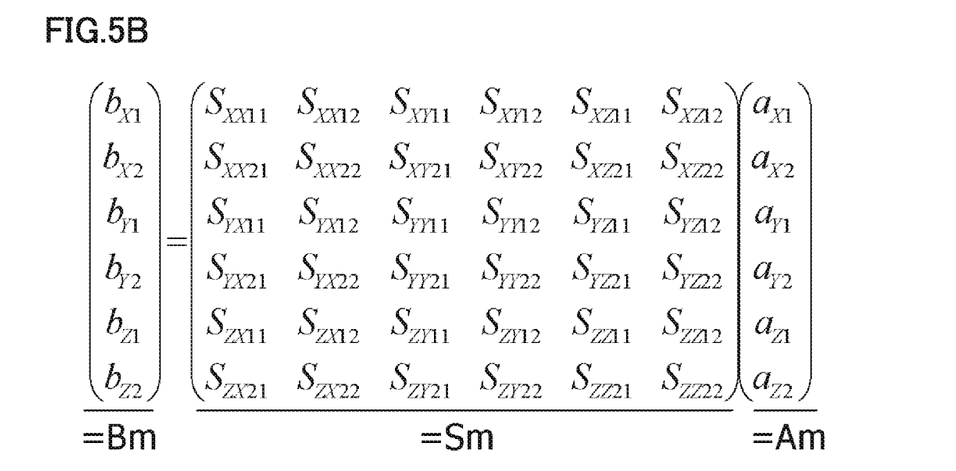
FIG. 5B is a diagram showing the relation among an input mode, an output mode and a mixed-mode S-parameter.

FIG. 5B shows the relation among an input mode signal $a_i$, an output mode signal $b_i$ and a mixed-mode S-parameter. When the matrix showing input mode signal $a_i$ is indicated as Am; the matrix showing output more signal $b_i$ is indicated as Bm; and the matrix showing a mixed-mode S-parameter is indicated as Sm, the following expression can be achieved:

$$Bm=SmAm \quad (2)$$

First, the following is an explanation about the case where an X mode and a Y mode that are input into a circuit component in the mode space correspond to an XA mode and a YA mode, respectively. In the XA mode, when the signal level variation on the A line is "1", the signal level variations on the B line and C line each correspond to "−1/2". In the YA mode, when the signal level variation on the B line is "1", the signal level variation on the C line corresponds to "−1", and the signal level variation on the A line corresponds to "0". In the Z mode, the signal level variations on all of the lines each correspond to "1".

The input/output in each mode in the mode space can be expressed as follows using the input/output signals through six ports:

Equation 1

$$\begin{aligned}
a_{X1} &= a_1 - \frac{1}{2}a_3 - \frac{1}{2}a_5 \\
b_{X1} &= b_1 - \frac{1}{2}b_3 - \frac{1}{2}b_5 \\
a_{X2} &= a_2 - \frac{1}{2}a_4 - \frac{1}{2}a_6 \\
b_{X2} &= b_2 - \frac{1}{2}b_4 - \frac{1}{2}b_6 \\
a_{Y1} &= a_3 - a_5 \\
b_{Y1} &= b_3 - b_5 \\
a_{Y2} &= a_4 - a_6 \\
b_{Y2} &= b_4 - b_6 \\
a_{Z1} &= a_1 + a_3 + a_5 \\
b_{Z1} &= b_1 + b_3 + b_5 \\
a_{Z2} &= a_2 + a_4 + a_6 \\
b_{Z2} &= b_2 + b_4 + b_6
\end{aligned} \quad (3)$$

Expression (3) can be summarized as in expressions (5) and (6) using a matrix M shown in the following expression (4).

Equation 2

$$M = \begin{pmatrix} 1 & 0 & -\frac{1}{2} & 0 & -\frac{1}{2} & 0 \\ 0 & 1 & 0 & -\frac{1}{2} & 0 & -\frac{1}{2} \\ 0 & 0 & 1 & 0 & -1 & 0 \\ 0 & 0 & 0 & 1 & 0 & -1 \\ 1 & 0 & 1 & 0 & 1 & 0 \\ 0 & 1 & 0 & 1 & 0 & 1 \end{pmatrix} \quad (4)$$

$$Am = MA \quad (5)$$

$$Bm = MB \quad (6)$$

In this case, matrixes A, B, Am, and Bm are as defined in FIGS. 4B and 5B.

When expression (1) is multiplied by matrix M from the left, the following expression is obtained.

$$MB=MSA=MSEA=MSM^{-1}MA \quad (7)$$

In this case, $M^{-1}$ is an inverse matrix of matrix M, and E is a unit matrix.

An expression (7) can be shown as follows using expressions (5) and (6).

$$Bm=MSM^{-1}Am \quad (8)$$

When comparing expression (2) and an expression (8), it turns out that a 6-port S-parameter and a mixed-mode S-parameter establish the following relation.

$$Sm = MSM^{-1} \qquad (9)$$

When the transparent characteristics in each mode are calculated using an expression (9), $S_{XAXA21}$, $S_{YAYA21}$ and $S_{ZZ21}$ of the mixed-mode S-parameters are obtained as follows:

Equation 3

$$S_{XAXA21} = \qquad (10)$$
$$\frac{2}{3}\left\{S_{21} - \frac{1}{2}(S_{23} + S_{25} + S_{41} + S_{61}) + \frac{1}{4}(S_{43} + S_{45} + S_{63} + S_{65})\right\}$$
$$S_{YAYA21} = \frac{1}{2}(S_{43} - S_{45} - S_{63} + S_{65})$$
$$S_{ZZ21} = \frac{1}{3}(S_{21} + S_{23} + S_{25} + S_{41} + S_{43} + S_{45} + S_{61} + S_{63} + S_{65})$$

Similarly, the following expressions are obtained by performing calculations also for the XB mode, the XC mode, the YB mode, and the YC mode.

Equation 4

$$S_{XBXB21} = \qquad (11)$$
$$\frac{2}{3}\left\{S_{43} - \frac{1}{2}(S_{45} + S_{41} + S_{63} + S_{23}) + \frac{1}{4}(S_{65} + S_{61} + S_{25} + S_{21})\right\}$$
$$S_{XCXC21} = \frac{2}{3}\left\{S_{65} - \frac{1}{2}(S_{61} + S_{63} + S_{25} + S_{45}) + \frac{1}{4}(S_{21} + S_{23} + S_{41} + S_{43})\right\}$$
$$S_{YBYB21} = \frac{1}{2}(S_{21} - S_{25} - S_{61} + S_{65})$$
$$S_{YCYC21} = \frac{1}{2}(S_{21} - S_{23} - S_{41} + S_{43})$$

As shown in the above-described expressions (10) and (11), the mixed-mode S-parameter showing the transparent characteristics in each mode corresponding to a transition pattern of the signal level on each of the three lines conforming to the MIPI C-PHY standards can be calculated from the 6-port S-parameter.

In a similar manner, a component corresponding to the mode transformation of a mixed-mode S-parameter can be calculated. For example, $S_{XAZ21}$ showing the transparent characteristics of mode transformation from the Z mode to the XA mode can be represented by the following expression.

Equation 5

$$S_{XAZ21} = \frac{1}{3}\left\{S_{21} + S_{23} + S_{25} - \frac{1}{2}(S_{41} + S_{43} + S_{45} + S_{61} + S_{63} + S_{65})\right\} \qquad (12)$$

$S_{ZXA21}$ showing the transparent characteristics of mode transformation from the XA mode to the Z mode can be represented by the following expression.

Equation 6

$$S_{ZXA21} = \frac{2}{3}\left\{S_{21} + S_{41} + S_{61} - \frac{1}{2}(S_{23} + S_{25} + S_{43} + S_{45} + S_{63} + S_{65})\right\} \qquad (13)$$

Figure 6:
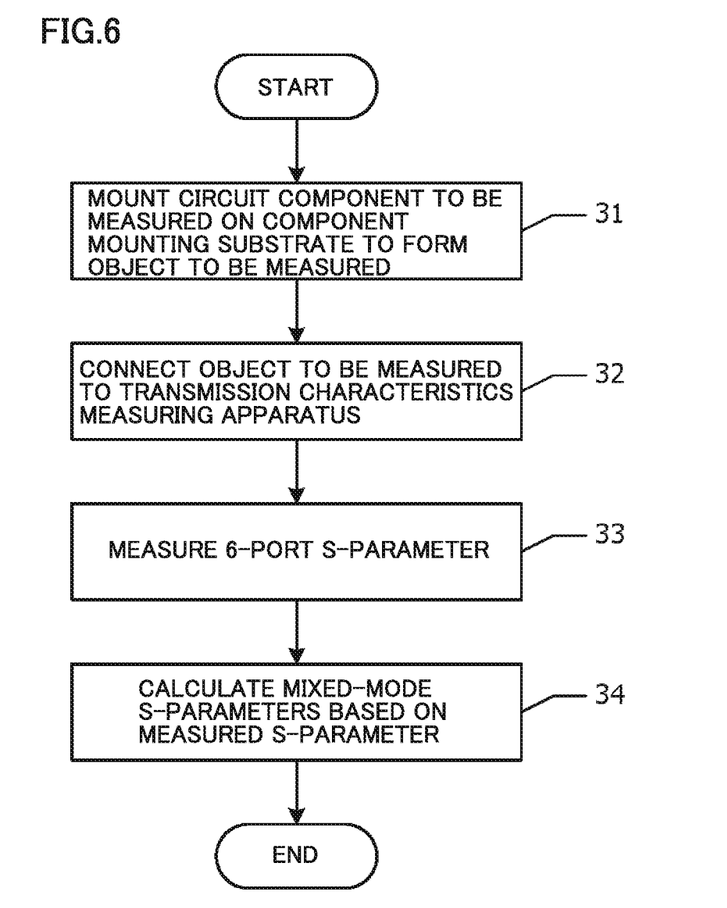
FIG. 6 is a flowchart illustrating a transmission characteristics measuring method according to the first embodiment.

FIG. 6 shows a flowchart illustrating a transmission characteristics measuring method according to the first embodiment. In step 31, a circuit component to be measured is mounted on component mounting portion 15 of component mounting substrate 11 (FIGS. 1A and 1B). Thereby, the circuit component to be measured is inserted into transmission lines 12A, 12B and 12C. Each of transmission lines 12A, 12B and 12C may be short-circuited at component mounting portion 15.

In step 32, test ports T1, T2, T3, T4, T5, and T6 of transmission characteristics measuring apparatus 20 (FIG. 2) are respectively connected to ports P1, P2, P3, P4, P5, and P6 of object to be measured 10. In step 33, the 6-port S-parameter of object to be measured 10 is measured by transmission characteristics measuring apparatus 20.

In step 34, based on the measurement values of the 6-port S-parameters, parameters $S_{XAXA21}$, $S_{XBXB21}$, $S_{XCXC21}$, $S_{YAYA21}$, $S_{YBYB21}$, $S_{YCYC21}$, and $S_{ZZ21}$ showing the transparent characteristics in each mode among the mixed-mode S-parameters are calculated. These parameters can be calculated using the above-described expressions (10) and (11). Expressions (12), (13) and the like may be used to calculate parameters $S_{XAZ21}$, $S_{ZXA21}$ and the like showing the mode transformation transparent characteristics.

The measurement values of the S-parameters measured by transmission characteristics measuring apparatus 20 (FIG. 2) are recorded on a removable media or the like, thereby allowing a mixed-mode S-parameter to be calculated using a personal computer or the like. Transmission characteristics measuring apparatus 20 may have a function of calculating a mixed-mode S-parameter based on the measurement results of the S-parameters. In this case, transmission characteristics measuring apparatus 20 may have a function of causing display device 21 to show the calculation results of the mixed-mode S-parameters in numerical values or in a graph form.

Second Embodiment

Then, referring to FIGS. 7A to 7C, a transmission characteristics measuring method and a transmission characteristics measuring apparatus according to the second embodiment will be hereinafter described. In the following, differences from the first embodiment will be described, but the description of the same configuration will not be repeated.

In the first embodiment, a network analyzer having at least six test ports is used as transmission characteristics measuring apparatus 20 (FIG. 2). In the second embodiment, a network analyzer having four test ports is used as transmission characteristics measuring apparatus 20.

Figure 7A:
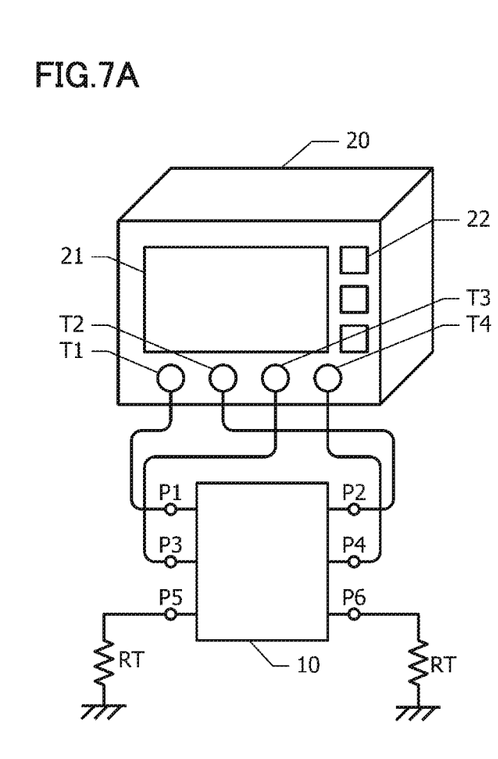
FIGS. 7A, 7B and 7C are diagrams each showing the configuration of connection between the transmission characteristics measuring apparatus and the object to be measured in the case where the transmission characteristics measuring method according to the second embodiment is employed to make measurements.

As shown in FIG. 7A, a transmission characteristics measuring apparatus 20 includes four test ports T1 to T4, a display device 21, and an input device 22. An operator inputs various commands into transmission characteristics measuring apparatus 20 through input device 22. Transmission characteristics measuring apparatus 20 causes display device 21 to show various pieces of information such as measurement results.

Four test ports T1, T2, T3, and T4 of transmission characteristics measuring apparatus 20 are respectively connected to four ports P1, P2, P3, and P4 provided in two transmission lines 12A and 12B among three transmission lines 12A, 12B and 12C of object to be measured 10. A termination resistor RT of 50Ω is connected to each of two ports P5 and P of one remaining transmission line 12C, so as to be reflection-free terminated. In this state, a 4-port S-parameter is measured.

Figure 7B:
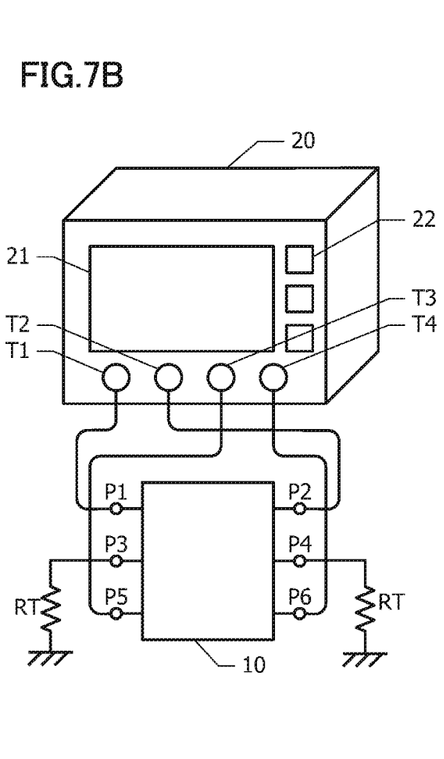
Figure 7C:
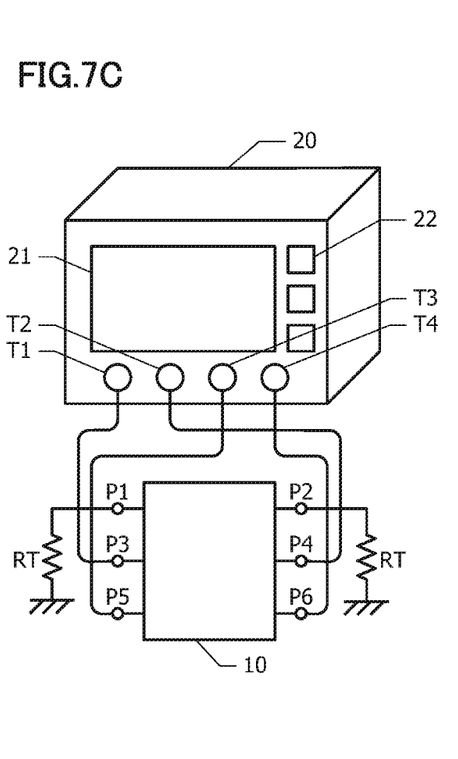

As shown in FIGS. 7B and 7C, the procedure for measuring a 4-port S-parameter is carried out in different combinations of two transmission lines connected to transmission characteristics measuring apparatus 20. Thereby, three types of 4-port S-parameters are obtained. FIG. 7B shows a connection configuration in which ports P1, P2, P5, and P6 of transmission lines 12A and 12C of object to be measured 10 are connected to transmission characteristics measuring apparatus 20 while ports P3 and P4 are reflection-free terminated. FIG. 7C shows the configuration in which ports P3 to P6 of transmission lines 12B and 12C of object to be measured 10 are connected to transmission characteristics measuring apparatus 20 while ports P1 and P2 are reflection-free terminated.

Based on the measurement results about three types of 4-port S-parameters, a 6-port S-parameter is calculated using a known method. The 6-port S-parameter can be calculated using a personal computer or the like.

In the second embodiment, a mixed-mode S-parameter of object to be measured 10 having six ports can be calculated using a network analyzer having only four test ports.

Third Embodiment

Then, referring to FIG. 8, a transmission characteristics measuring method and a transmission characteristics measuring apparatus according to the third embodiment will be hereinafter described. In the following, differences from the second embodiment will be described, but the description of the same configuration will not be repeated. In the third embodiment, a network analyzer having four test ports T1 to T4 is used as transmission characteristics measuring apparatus 20 (FIGS. 7A to 7C), as in the second embodiment.

Figure 8:
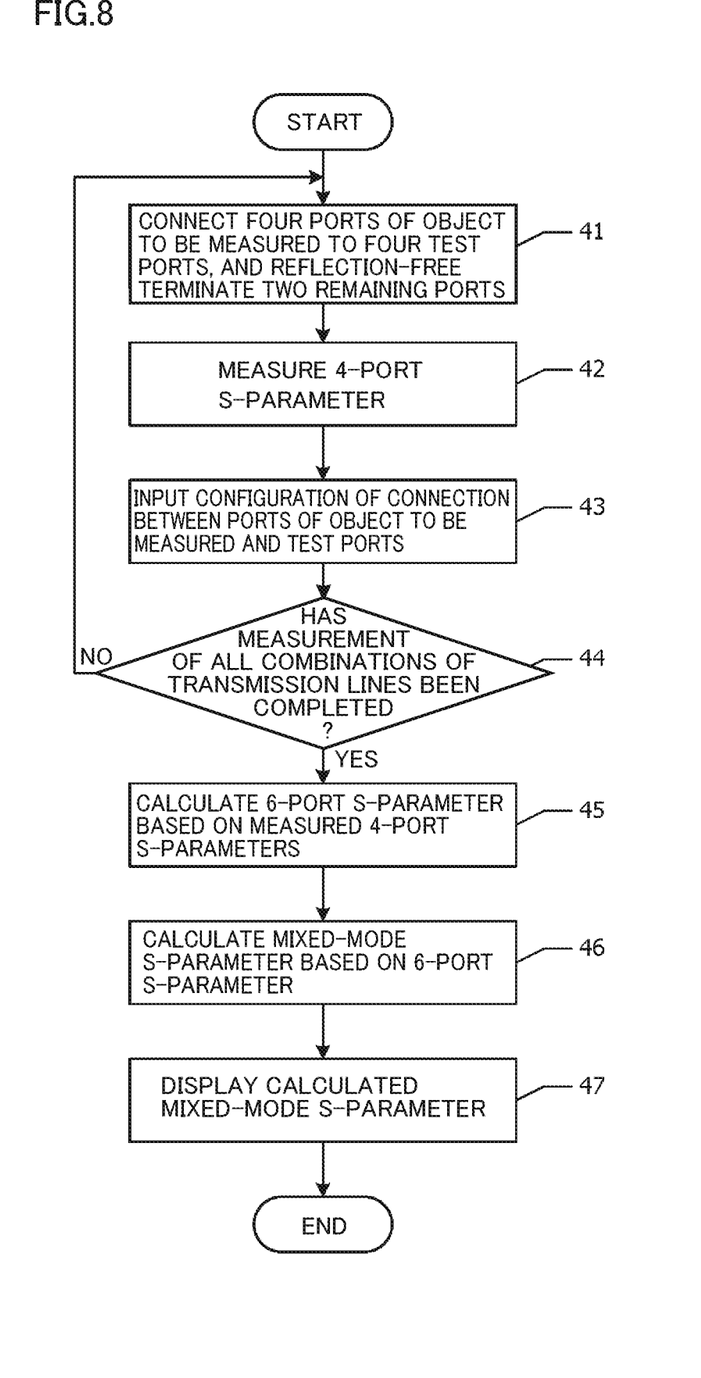
FIG. 8 is a flowchart illustrating a transmission characteristics measuring method according to the third embodiment.

FIG. 8 shows a flowchart illustrating a transmission characteristics measuring method according to the third embodiment. In step 41, for example, as shown in FIG. 7A, four ports P1, P2, P3, and P4 corresponding to transmission lines 12A and 12B of object to be measured 10 are respectively connected to four test ports T1, T2, T3, and T4 of transmission characteristics measuring apparatus 20 while two remaining ports P5 and P6 are reflection-free terminated. In step 42, a 4-port S-parameter is measured. In step 43, the configuration of connection between ports P1 to P4 of object to be measured 10 and four test ports T1 to T4 of transmission characteristics measuring apparatus 20 is input into transmission characteristics measuring apparatus 20 by an operator through input device 22. Thereby, transmission characteristics measuring apparatus 20 can associate the measured 4-port S-parameters with four ports P1 to P4 of object to be measured 10.

In step 44, it is determined whether measurement of the 4-port S-parameters has been completed or not for all combinations of the three transmission lines of object to be measured 10. This determination is made by an operator. If the measurement of the 4-port S-parameters has not been completed for all combinations of the three transmission lines, steps 41 to 43 are carried out for the combinations for which the measurement has not been completed. Thereby, the 4-port S-parameters are measured for all of the connection configurations shown in FIGS. 7A, 7B and 7C.

In step 45, transmission characteristics measuring apparatus 20 calculates a 6-port S-parameter based on three types of 4-port S-parameters that have been measured. In step 46, transmission characteristics measuring apparatus 20 calculates a mixed-mode S-parameter based on the calculated 6-port S-parameter. This calculation can be performed using the same method as that in step 34 (FIG. 6) in the first embodiment. In step 47, transmission characteristics measuring apparatus 20 causes display device 21 (FIG. 7A and the like) to display the information showing the calculated mixed-mode S-parameter.

In the third embodiment, a network analyzer having four ports has: a function of calculating a 6-port S-parameter from three types of 4-port S-parameters; and a function of calculating a mixed-mode S-parameter from the 6-port S-parameters. Thereby, a mixed-mode S-parameter can be calculated without using a personal computer or the like.

Fourth Embodiment

Then, referring to FIG. 9, a transmission characteristics measuring method and a transmission characteristics measuring apparatus according to the fourth embodiment will be hereinafter described. In the following, differences from the third embodiment will be described, but the description of the same configuration will not be repeated. In the third embodiment, an operator inputs the configuration of connection between the ports of object to be measured 10 and the test ports of transmission characteristics measuring apparatus 20 (step 43 in FIG. 8).

Figure 9:
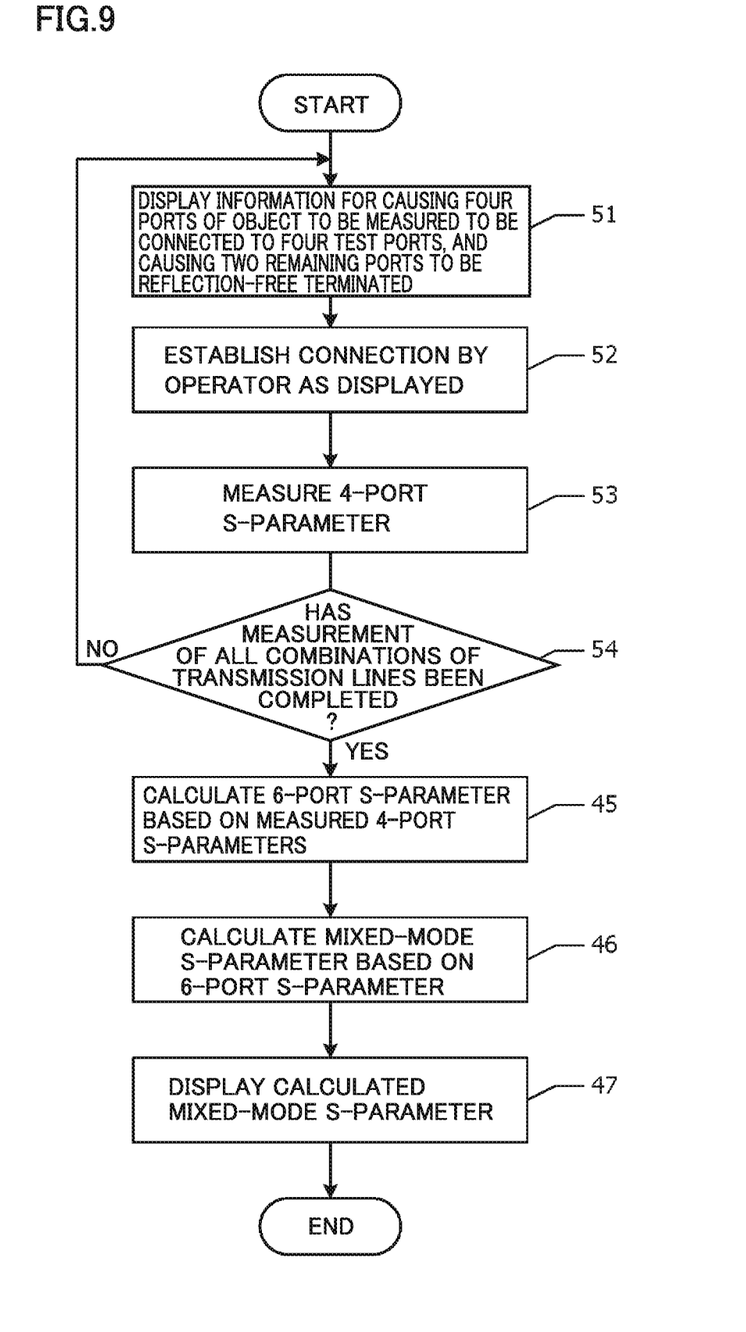
FIG. 9 is a flowchart illustrating a transmission characteristics measuring method according to the fourth embodiment.

FIG. 9 shows a flowchart illustrating a transmission characteristics measuring method according to the fourth embodiment. In the fourth embodiment, in step 51, transmission characteristics measuring apparatus 20 causes display device 21 to display (i) information showing the configuration of connection between four ports of object to be measured 10 and test ports of transmission characteristics measuring apparatus 20, and (ii) information used for causing two remaining ports to be reflection-free terminated. In step 52, the operator establishes a connection as displayed on display device 21.

In step 53, transmission characteristics measuring apparatus 20 measures a 4-port S-parameter. In step 54, it is determined whether measurement of the 4-port S-parameters has been completed or not for all combinations of the three transmission lines of object to be measured 10. This determination is made by transmission characteristics measuring apparatus 20.

If the measurement of the 4-port S-parameters has not been completed for all combinations of the three transmission lines, steps 51 to 53 are carried out for the combinations for which the measurement has not been completed. Thereby, the 4-port S-parameters are measured for all combinations shown in FIGS. 7A, 7B and 7C. The process from steps 45 to 47 after completion of the measurement of the 4-port S-parameters for all combinations of the three transmission lines is the same as the process in the third embodiment shown in FIG. 8.

In the fourth embodiment, the operator establishes a connection as instructed by transmission characteristics measuring apparatus 20 such that the operator can make a measurement.

Although the embodiments of the present disclosure have been described as above, it should be understood that the embodiments disclosed herein are illustrative and non-re-

What is claimed is:

1. A transmission characteristics measuring method comprising:
   measuring an S-parameter of an object to be measured, the object to be measured including (i) three transmission lines configured such that a ternary signal is transmitted through a corresponding one of the three transmission lines and (ii) six ports as total ports included in the three transmission lines each having a pair of ports; and
   based on the S-parameter measured, calculating a parameter of each mode, which shows a transparent characteristic in each mode among mixed-mode S-parameters, each mode being defined in accordance with transition patterns of signal levels on the three transmission lines.

2. The transmission characteristics measuring method according to claim 1, wherein the mixed-mode S-parameters are defined in a mode space including a plurality of modes when a transition pattern showing an equivalent amount of signal level variations of the signal levels on the three transmission lines is defined as one mode, and when a transition pattern showing an identical variation of the signal levels on the three transmission lines is defined as another mode.

3. The transmission characteristics measuring method according to claim 1, wherein
   the S-parameter is a 6-port S-parameter, and
   the measuring an S-parameter includes measuring the S-parameter in a state where each of test ports of a transmission characteristics measuring apparatus having at least six test ports is connected to a corresponding one of the six ports of the object to be measured.

4. The transmission characteristics measuring method according to claim 1, wherein
   the S-parameter includes three types of 4-port S-parameters, and
   the measuring an S-parameter includes performing a procedure for measuring a 4-port S-parameter in a state where each of four test ports of a transmission characteristics measuring apparatus is connected to a corresponding one of four ports corresponding to two transmission lines of the three transmission lines of the object to be measured while two ports of one remaining transmission line of the three transmission lines are reflection-free terminated, the procedure being performed in different combinations of two transmission lines connected to the transmission characteristics measuring apparatus, to thereby measure three types of 4-port S-parameters.

5. The transmission characteristics measuring method according to claim 1, wherein each of the three transmission lines of the object to be measured extends continuously from one port to the other port.

6. The transmission characteristics measuring method according to claim 1, wherein a noise filter is inserted into the three transmission lines of the object to be measured.

7. A transmission characteristics measuring apparatus comprising:
   at least six test ports; and
   a display device,
   the transmission characteristics measuring apparatus being configured to
   measure a 6-port S-parameter in a state where each of the six test ports is connected to a corresponding one of six ports of an object to be measured, the object to be measured including (i) three transmission lines configured such that a ternary signal is transmitted through a corresponding one of the three transmission lines and (ii) the six ports as total ports included in the three transmission lines each having a pair of ports,
   based on the 6-port S-parameter measured, calculate a parameter of each mode, which shows a transparent characteristic in each mode, among mixed-mode S-parameters, each mode being defined in accordance with transition patterns of signal levels on the three transmission lines, and
   cause the display device to display a calculation result.

8. A transmission characteristics measuring apparatus comprising:
   four test ports; and
   a display device,
   the transmission characteristics measuring apparatus being configured to
   for an object to be measured including (i) three transmission lines configured such that a ternary signal is transmitted through a corresponding one of the three transmission lines and (ii) six ports as total ports included in the three transmission lines each having a pair of ports, perform a procedure for measuring a 4-port S-parameter in a state where each of the four test ports is connected to a corresponding one of four ports of two transmission lines of the three transmission lines while two ports of one remaining transmission line of the three transmission lines are reflection-free terminated, the procedure being performed in different combinations of two transmission lines connected to the four test ports, to thereby measure three types of 4-port S-parameters,
   based on the three types of 4-port S-parameters measured, calculate a parameter of each mode, which shows a transparent characteristic in each mode, among mixed-mode S-parameters, each mode being defined in accordance with transition patterns of signal levels on the on the three transmission lines, and
   cause the display device to display a calculation result.

9. The transmission characteristics measuring apparatus according to claim 8, further comprising an input device, wherein
   the transmission characteristics measuring apparatus is configured to receive, through the input device, information showing the four ports each connected to a corresponding one of the four test ports among the six ports of the object to be measured, so as to associate the 4-port S-parameters measured and ports of the object to be measured with each other.

10. The transmission characteristics measuring apparatus according to claim 8, wherein
    the transmission characteristics measuring apparatus is configured to
    cause the display device to display information showing the four ports each to be connected to a corresponding one of the four test ports among the six ports of the object to be measured; and
    based on the information displayed on the display device, associate the 4-port S-parameters measured and ports of the object to be measured with each other.

* * * * *